United States Patent [19]

Hutter

[11] Patent Number: 5,057,443
[45] Date of Patent: Oct. 15, 1991

[54] METHOD FOR FABRICATING A TRENCH BIPOLAR TRANSISTOR

[75] Inventor: Louis N. Hutter, Richardson, Tex.

[73] Assignee: Texas Instruments Incorporated, Dallas, Tex.

[21] Appl. No.: 523,436

[22] Filed: May 14, 1990

Related U.S. Application Data

[62] Division of Ser. No. 213,212, Jun. 29, 1988, Pat. No. 4,929,996.

[51] Int. Cl.$^5$ .......................................... H01L 21/328
[52] U.S. Cl. ...................................... 437/31; 437/33; 437/67; 437/78; 437/203
[58] Field of Search ....................... 437/31, 67, 78, 32, 437/33, 203; 357/34

[56] References Cited

U.S. PATENT DOCUMENTS

| | | | |
|---|---|---|---|
| 4,666,557 | 5/1987 | Collins et al. | 156/643 |
| 4,676,847 | 6/1987 | Lin | 437/67 |
| 4,728,624 | 3/1988 | Silvestri et al. | 437/90 |
| 4,749,661 | 6/1988 | Bower | 437/33 |
| 4,847,214 | 7/1989 | Robb et al. | 437/67 |
| 4,860,085 | 8/1989 | Feygenson | 357/59 |
| 4,929,996 | 5/1990 | Hutter | 357/34 |

FOREIGN PATENT DOCUMENTS

| | | |
|---|---|---|
| 60-117664 | 6/1985 | Japan . |
| 61-171162 | 8/1986 | Japan . |
| 63-36564 | 2/1988 | Japan . |
| 63-292644 | 11/1988 | Japan . |

Primary Examiner—Brian E. Hearn
Assistant Examiner—T. N. Quach
Attorney, Agent, or Firm—B. Peter Barndt; James T. Comfort; Melvin Sharp

[57] ABSTRACT

A bipolar transistor formed in a trench depression such that a single impurity diffusing step is effective to form a buried collector layer electrically connected to a vertical collector conductor. The lateral diffusion forming the vertical collector conductor is effective to form the conductor with a uniform vertical doping profile, thereby reducing non-uniform series collector resistance characteristics. A trench depression sidewall dielectric is formed, and the trench is filled with a transistor silicon material by a selective epitaxial process. Base and emitter region are then formed in the collector epitaxial material.

25 Claims, 4 Drawing Sheets

A METHOD FOR FABRICATING A TRENCH BIPOLAR TRANSISTOR

This is a division of application Ser. No. 213,212, filed 06/29/88 now U.S. Pat. No. 4,929,996.

RELATED APPLICATION

"MERGED BIPOLAR-CMOS TRANSISTOR FABRICATION PROCESS", by Louis N. Hutter, filed concurrently herewith, Ser. No. 07/213,006, now U.S. Pat. No. 4,926,233, attorneys docket No. TI-12596.

TECHNICAL FIELD OF THE INVENTION

The present invention relates in general to the semiconductor fabrication techniques and resulting structures, and more particularly relates to the fabrication of trench-type bipolar transistors and resulting structures.

BACKGROUND OF THE INVENTION

Bipolar transistors comprise a family of semiconductor devices which exhibit excellent high-speed and high current carrying capabilities. The bipolar family of transistors is also well suited for high voltage operations, typically between five and fifty volts, and in some situations up to hundreds of volts. When operating at voltages above standard digital logic voltages, the electrical isolation between adjacent bipolar transistors becomes a significant integrated circuit design and fabrication factor. In addition, in fabricating the noted high current carrying bipolar transistors, the collector resistance is another important design and fabrication consideration.

A conventional technique for electrically isolating adjacent integrated bipolar transistors comprises the standard buried collector (SBC) technique. According to this fabrication technique, an N-type epitaxial semiconductor layer is formed over the surface of a P-type substrate. The epitaxial material is a high quality single crystal silicon material in which the bipolar transistors are formed. Next, the wafer is masked and patterned to define the deep P+ isolation diffusion regions for isolating a number of N-type epitaxial regions from each other. High temperature and extended time diffusion processes drive the P-type impurities all the way through the epitaxial layer to form islands of the N-type single crystal silicon material. With proper biasing, the deep diffusions are effective to isolate each of the transistor islands from the other. The epitaxial material is generally an N-type material in which base and emitter regions are formed to complete an NPN transistor.

High voltage bipolar transistors are generally characterized by a thicker epitaxial layer to provide sufficient breakdown voltage characteristics to the various semiconductor regions. However, in order to diffuse isolation regions through the thick epitaxial layer, extended diffusion periods must be utilized. As a consequence of extending the diffusion time periods to achieve deep diffusion isolation regions, such diffusions also spread laterally. The lateral spreading requires additional wafer area, thereby increasing the surface wafer area per device. Thus, additional wafer area must be considered in the design of high voltage bipolar transistors in order to provide adequate spacing between isolated devices to prevent isolation punchthrough which can effectively connect the devices together. It has been found that as much as seventy percent of the area required for a high voltage bipolar transistor is not utilized for the active device itself, but rather for allowing sufficient isolation area for the deep diffusions.

High current carrying bipolar transistors are generally fabricated with a buried collector which comprises a heavily doped layer between the substrate and the epitaxial layer. A deep N+ diffusion is formed through the epitaxial layer for contacting the buried collector so as to provide a surface contact thereto. With such a construction, the deep N+ diffusion provides a vertical conductor to the buried collector, but also provides an inherent resistance gradient which, in high current applications, can present a significant voltage drop within the vertical collector conductor. Because the vertical collector conductor is diffused downwardly from a surface mask opening, a diffusion gradient is inherently formed from the wafer surface to the buried collector. Because of the noted diffusion characteristics, the conductivity at the surface of the collector contact is high, but decreases as a function of distance into the epitaxial material. As a result, the conductivity of the collector conductor near the buried collector is reduced, thereby presenting an undesirable series resistance in the collector path.

In addition to the noted collector resistance problem, the deep N+ diffusion forming the collector conductor also spreads laterally. This lateral spreading not only requires additional wafer area, but also must be considered in providing adequate spacing of the diffused N+ conductor between the transistor base region and the P+ isolation region. Adequate spacing of the noted regions is required to ensure that the associated breakdown voltages are sufficiently high.

From the foregoing, it can be seen that a need exists for a bipolar transistor with improved isolation and conductivity characteristics. There is an associated need for a bipolar transistor whose construction yields lower collector resistance, requires a smaller wafer area and fewer masking steps as compared to conventional bipolar transistor fabrication techniques.

SUMMARY OF THE INVENTION

In accordance with the invention, there is provided a bipolar transistor method and resulting structure which eliminates or substantially reduces the disadvantages and shortcomings of prior techniques and structures. According to an important technical advantage of the invention, the bipolar transistor is enclosed within a dielectric cylinder to provide a high degree of electrical isolation while yet conserving wafer area. Another important technical advantage of the invention is that a surface contact is made to a buried collector by a vertical collector conductor which exhibits a uniform conductivity, as measured in the vertical direction. As such, the vertical resistance or conductivity gradient is minimized, thereby lowering the series collector resistance.

In accordance with the preferred embodiment of the invention, a trench depression is formed in the face of a semiconductor substrate using a hard mask material. The wafer is subjected to a diffusion, wherein a high conductivity region is formed on the sidewalls and bottom of the trench depression. The high conductivity trench bottom defines the buried collector, while the high conductivity sidewalls of the trench define the vertical collector conductor. Because the sidewalls of the trench depression are simultaneously subjected to a lateral diffusion of impurities, a uniform doping profile is achieved vertically within the trench depression sidewalls. In addition, the vertical collector conductor entirely encircles the transistor of the invention to further reduce collector resistance. Hence, no deep top-down diffusions with the inherent vertical resistance gradient are required.

A conformal layer of a dielectrical material is then deposited over the surfaces of the trench depression, and anisotropically etched thereby leaving only sidewall deposits of the dielectric. The dielectric material on the bottom of the trench depression is thus entirely removed, while the hard mask material yet covers the surface of the wafer. The sidewall deposits of the dielectric function to isolate the N+ vertical collector conductor from the transistor base region. When utilizing a relatively thin dielectric, the transistor base and collector conductor can be formed closely together, thereby realizing a transistor of smaller size than possible with SBC type of transistors.

Next, the dielectric-lined trench depression is filled with an epitaxially grown semiconductor material, using the silicon bottom surface of the trench depression as the basis for the epitaxial growth. The epitaxial island formed within the cylindrical dielectric shell comprises a semiconductor island of collector material, in which the semiconductor base and emitter regions are formed.

A significant technical advantage of the invention is that with the transistor construction of the invention, much smaller area transistors can be fabricated using few masks than heretofore realized.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or regions throughout the views, and in which.

DETAIL DESCRIPTION OF THE INVENTION

FIGS. 1–10 illustrate the major steps in fabricating the improved bipolar transistor of the invention. It is therefore understood that many other and additional and necessary steps may be included within the fabrication process to further refine or develop other structural aspects of a bipolar transistor. Also, the transistor of the invention is described below in terms of basic fabrication parameters to form an NPN transistor having general operating characteristics. Those skilled in the art will readily realize that to emphasize certain transistor characteristics, the dimension, areas, doping levels or other types of impurities may be selected, adjusted or altered to achieve such special or refined characteristics.

Figures 1, 2:
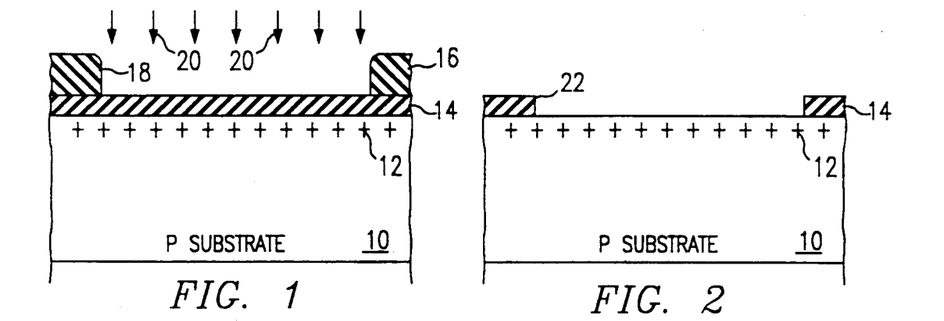
FIGS. 1–10 are sectional views of a semiconductor wafer illustrating the major sequential steps in fabricating the bipolar transistor of the invention.

With reference now to FIG. 1, there is illustrated a P-type semiconductor substrate 10 forming the basis on which the transistors of the invention are formed. The thickness of the substrate 10 is not shown to scale. An acceptor-type impurity 12 is implanted into the surface of the substrate 10 to form a channel stop. Boron is utilized as the impurity in the preferred form of the invention. The channel stop 12 eliminates punchthrough between adjacent semiconductor regions, thereby providing a surface isolation. The channel stop impurity is implanted to a dosage sufficient to limit depletion, such that when adjacent semiconductor regions are at diverse voltages, the depletion region cannot reach between such semiconductor regions. Hence, punchthrough is reduced or eliminated. In addition, in fabricating bipolar devices, many parasitic FET or MOS devices are also formed. With the channel stop implant 12, the thick field threshold voltage is increased, thereby reducing the effects of the parasitic MOS devices.

Continuing with the fabrication process, a hard trench mask layer 14 of material is deposited over the surface of the substrate 10 to function as a mask for subsequent silicon etching processes. In the preferred form of the invention, a silicon dioxide (oxide) layer 14 is grown to a thickness of about one micron. Deposited silicon oxides can also be utilized. The hard mask layer 14 also functions as a sacrificial layer for the noted subsequent etching of the silicon substrate 10. In the alternative, the hard mask layer 14 can be a multiple layer structure, comprising oxide-nitride-oxide materials. Such a stacked construction is well known in the art, and can be easily integrated into the fabrication process of the invention.

A photoresist layer 16 is next spun or otherwise deposited over the surface of the wafer and patterned to define one or more openings 18 to locate trench depressions within the substrate 10. More particularly, the photoresist 16 is patterned to define areas for the removal of the exposed hard mask layer portions 14. An oxide dry etch 20, preferably of the plasma type, is then conducted to effect a removal of the hard mask within the areas patterned by the photoresist 16.

FIG. 2 illustrates the wafer after the patterning of the hard mask layer 14. The photoresist 16 is removed and the hard mask layer 14 then functions as a mask for the subsequent etching of the silicon substrate material 10. The opening 22 formed within the hard mask layer 14 may comprise a particular geometric shape to accommodate a single bipolar transistor, multiple bipolar transistors, or multiple transistors and other passive elements such as semiconductor resistors. As noted, the channel stop 12 functions to maintain electrical separation of such transistors or passive components by reducing the noted MOS parasitic devices. In the event that a single bipolar transistor of the invention is formed within a single area defined within the substrate 10, then the channel stop 12 may be unnecessary. The openings 22 within the hard mask layer 14 may be as small as several microns for a single transistor of the invention, or may be up to two hundred microns, or more, to accommodate plural transistors and other semiconductor circuit components.

Figure 3:
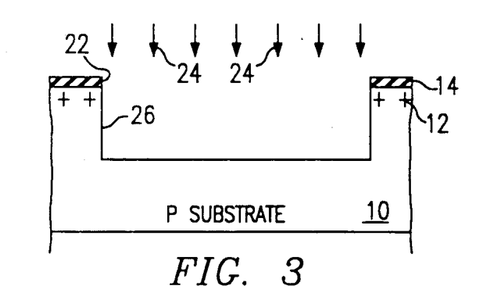

With reference now to FIG. 3, the wafer is shown after having undergone an anisotropic silicon etch 24. The anisotropic etch 24 effects a removal of the silicon material of the substrate 10, as defined by the patterned hard mask layer 14. The thickness of the hard mask layer 14 is shown as being thinner than originally deposited. This is primarily due to the erosion thereof during the dry anisotropic etch 24. Plasma etch chemistries are currently available for etching silicon material in an anisotropic manner.

The depth of the trench depression 26 formed within the substrate 10 is a function of the breakdown voltage characteristics desired of the transistor to be formed at such location. As noted above, the trench depression 26 may be deeper for accommodating a thicker epitaxial layer to provide increased breakdown voltage characteristics of transistors. For example, the fabrication of +5 volt bipolar devices normally used in digital applications may require a trench depression in the range of 1-2 microns deep. For twenty volt bipolar devices normally used in linear applications, a trench depression of around eight microns thick may be required. For high voltage bipolar transistors which require a greater distance between the base-collector junction and the buried collector, the depth of the trench depression 26 may be in the order of fifteen microns deep. Hence, the depth of the trench depression 26, which is easily controlled by the etch 24, can be utilized to define the $BV_{ceo}$ characteristics of the bipolar transistor formed therein.

Figure 4:
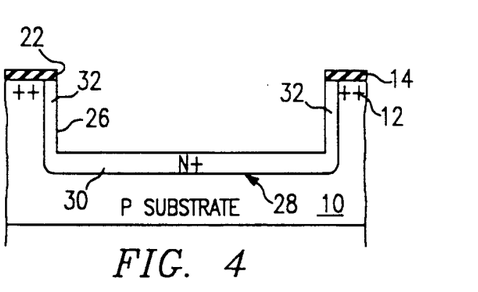

After forming the trench depression 26, the wafer is subjected to a gaseous diffusion which is effective to diffuse N-type impurities into the surfaces of the trench depression 26. FIG. 4 illustrates the heavily doped conductive structure 28 which is formed in all surfaces of the trench depression 26, including sidewalls and bottom. The heavily doped region 30 formed at the bottom of the trench depression 26 defines a buried collector region of the bipolar transistor of the invention. Formed in electrical contact and continuous with the buried collector 30 is a vertical collector conductor 32 which is formed as a result of the lateral diffusion of impurities into the sidewalls of the trench depression 26. The vertical collector conductor 32 is self-aligned with the buried layer 30 without a mask and patterning step, as is necessary with the SBC type of transistors.

In accordance with an important feature of the invention, the lateral diffusion of impurities into the sidewalls of the trench depression 26 provides substantially a uniform conductivity from the top of the vertical collector conductor 32 to the bottom thereof. Hence, with a uniform collector conductor conductivity, a reduced resistance gradient is formed therein, in contrast with the well known standard buried collector techniques. While there exists a lateral diffusion impurity gradient in the collector conductor 32, such a gradient is of little consequence since collector current flows vertically therein. The lowest resistance area of the collector conductor 32 is near the surface of the sidewalls of the trench depression 26.

Dopant impurities having slow diffusing properties, such as antimony and arsenic, may be utilized in forming the diffusion region 28. While the diffusion region 28 is described as being formed by a gaseous diffusion, new ion implanting techniques may be utilized for driving impurities uniformly into the sidewalls, as well as the bottom of the trench depression 26. Current ion implant techniques are being developed for driving impurity ions into the sidewalls of trenches. Because the trench structures of the invention are relatively wide, the angular orientation of ion implanting equipment may be more easily utilized to form the vertical collector conductors 32.

In order to further reduce the collector resistance exhibited by the sidewall diffusion area 30, a silicide process can be carried out at the wafer fabrication stage shown in FIG. 4. To form silicided sidewalls and bottom of the trench depression 26, a refractory metal, such as tungsten, can be deposited over the surface of the wafer. Such a metal can be deposited using LPCVD techniques. Other refractory metals may be utilized with equal effectiveness. Next, the metal is reacted with the underlying silicon material by a conventional heat cycling step to form a low resistance silicide surface on the sidewalls and the bottom of the trench depression 26. The sheet resistance of the silicided silicon material drops to about one ohm per square, thereby significantly reducing the transistor series collector resistance. An acid etch can be employed to remove any unreacted refractory metal. In order to enhance a selective epitaxial growth of silicon material within the trench depression, an anisotropic etch can be utilized to remove some or all of the silicide material on the bottom of the trench depression 26.

Figure 5:
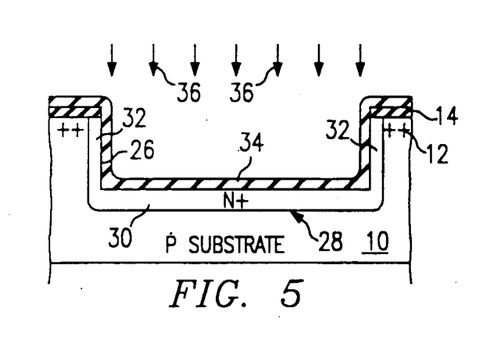
Figure 6:
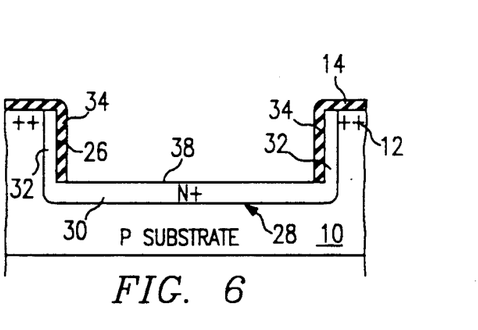

Referring now to FIG. 5, a conformal dielectric 34, such as silicon oxide, is shown deposited over the surface of the wafer, including the trench depression 26. A low pressure chemical vapor deposition (LCPVD) type of oxide is preferably utilized, and may be of the type utilizing TEOS. The thickness of the conformal dielectric 34 may be anywhere from 1000 angstroms to 1 micron, or other depth to suit particular purposes. As noted in FIG. 5, the composite layer construction, including the hard mask layer 14 and the conformal material 34 is of increased depth on areas comprising the top surface of the substrate 10. The wafer is then subjected to a dry etch of the anisotropic type for removing the conformal material 34 uniformly in a vertical direction. Plasma etches are well suited for this type of etch. The anisotropic etch 36 is continued until the conformal material 34 deposited on the bottom surface of the trench depression 26 is entirely removed, thereby leaving a sidewall dielectric, as shown in FIG. 6. The surface coating of the hard mask material remains on the surface of the wafer. With such an etching technique, the entire surface of the wafer remains covered with either the hard mask layer 14 or the sidewall dielectric 34, except for the bottom 38 of the trench depression 26. Importantly, the only silicon material exposed comprises that on the bottom 38 of the trench depression 26.

Figure 7:
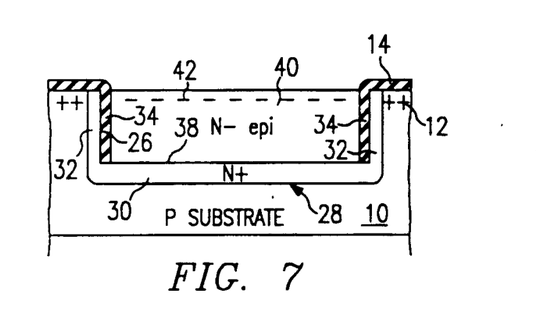

The dielectric lined trench depression 26 is next filled with a single crystal lightly doped N-type semiconductor material, as shown by FIG. 7. The trench depression filling operation is carried out utilizing a selective epitaxial growth technique, such as the type described in either of the technical articles "A New Isolation Technology For Bipolar Devices By Low Pressure Selective Silicon Epitaxy", by Hine et al., VLSI Symposium Tech. Digest, pp. 116-117, 1982; or "Advanced Dielectric Isolation Through Selective Epitaxial Growth Techniques", by Borland et al., Solid State Technology, August, 1985, the disclosures of such articles being incorporated herein by reference. According to such silicon growth process, the epitaxial semiconductor material 40 is deposited or grown only at those locations having exposed or virgin single crystal silicon material, such as the bottom 38 of the dielectric lined trench depression 26. The epitaxial semiconductor material 40 does not nucleate, or grow, at non-silicon locations, such as on the silicon oxide layer 14. The epitaxial growth process is effective to deposit the single crystal semiconductor material 40 to a defined thickness as a function of time. Such process is carried out for a period of time sufficient to fill the dielectric lined trench depression 26.

As noted in FIG. 7, the dielectric lined trench depression 26 is shown filled with the epitaxial semiconductor material 40, preferably to a depth such that the top surface thereof is generally level with the surface of the substrate 10. Subsequent to the growth of the epitaxial island of silicon, the wafer can be subjected to an ion implant, wherein donor atoms 42 can be driven into the silicon surface to form a channel stop. A dosage of about $10^{12}$ atoms per $cm^2$ of phosphorus or arsenic is effective to accomplish the surface impurity concentration. The dopant impurities 42 function as a channel stop in the transistor site to increase the thick field threshold of devices formed within the epitaxial material 40. As an alternative, and during the later stages of the epitaxial growth process, the donor impurity can be introduced into the reaction chamber so that a suitable surface concentration of the donor atoms 42 is formed. Semiconductor resistors can thus be formed in the epitaxial material 40 and yet be isolated by the channel stop 42. The channel stop 42 prevents the operation of parasitic MOS devices which could otherwise be effective to short-circuit the various components formed within the epitaxial material 40.

At this juncture of the semiconductor processing, the wafer can be planarized to remove the surface portions of the silicon oxide 14 in preparation for forming the bipolar transistor of the invention and other devices within the epitaxial material 40. Conventional planarizing steps can be utilized, as is well known in the art, followed by a new oxide layer which is patterned to define the components to be formed within the epitaxial material 40. In the example, only a single transistor is formed, and thus the planarization and reoxidation steps are not utilized.

Figure 8:
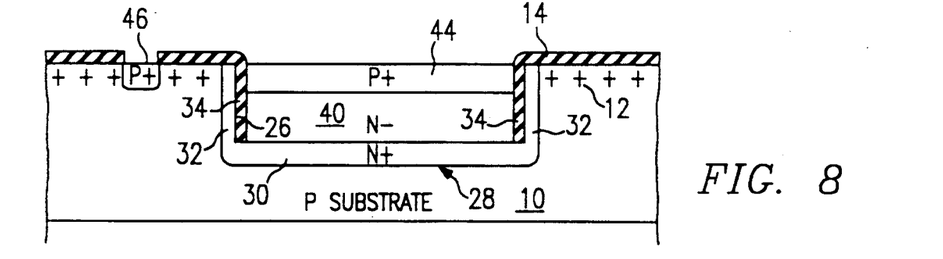

FIG. 8 illustrates the results of a mask and patterning step in which the hard mask 14, or other maskable material, is masked to form P-type semiconductor regions. In the preferred form of the invention, the entire top surface of the epitaxial material 40, as well as a surface portion of the substrate 10 have been opened for forming therein the P-type semiconductor regions.

As noted above, masking of the epitaxial material 40 may be advantageously utilized for fabricating semiconductor resistors and lateral PNP bipolar transistors therein. The wafer is then subjected to a diffusion process, in which P-type impurities are diffused into the exposed areas of the epitaxial material 40, as well as the substrate 10. In the alternative, an ion implant process can be utilized to construct the P-type semiconductor regions. Formed within the patterned semiconductor surfaces is a heavily doped P-type semiconductor region 44 defining a base region of the NPN transistor of the invention. Significantly, the base region 44 is formed self-aligned according to the hard mask 14. According to another important feature of the invention, the base region 44 is separated from the vertical collector conductor 32 by only the thickness of the sidewall dielectric 34. A more compact transistor can thus be realized.

The semiconductor base region 44 may be formed with a thickness depending on the type of transistor and the electrical characteristics thereof desired. For high speed bipolar transistors, the base thickness of region 44 may be about 1.5 microns, or even thinner. For linear applications, semiconductor base region 44 may be constructed with a depth in the range of 2.5 to 3 microns. The doping level of the base region 44 can also be selected to suit particular needs, but is shown as a heavily doped region with a concentration of about $10^{19}$ atoms per $cm^3$. Those skilled in the art may prefer to form the base region 44 having a more lightly doped impurity concentration to improve the speed performance of the bipolar transistor of the invention. The diffusion of the P-type impurities into the epitaxial material 40 overwhelms the unmasked areas of channel stop impurities 42. However, in the portions of the epitaxial material which remain masked, where masking is utilized, the channel stop impurities 42 remain effective to increase the thick field threshold. Also formed in the substrate 10 is a heavily doped P-type semiconductor region 46 which is utilized to make surface electrical contact with the substrate 10.

Figure 9:
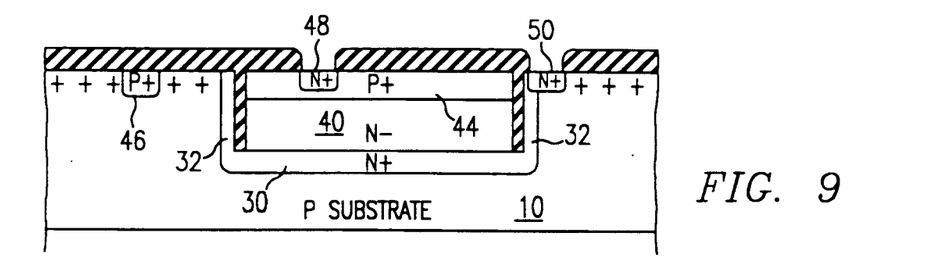

The wafer then undergoes a diffusion process for forming N-type semiconductor regions on surface areas of the wafer. As illustrated in FIG. 9, the wafer is covered with a maskable material, and masked and patterned to define those areas for forming the N-type semiconductor regions. Particularly, the wafer is masked to form a heavily doped N-type semiconductor region 48 to define a semiconductor emitter region of the transistor. The emitter region 48 is formed within the semiconductor base region 44. In addition, an additional N-type semiconductor region 50 is formed in the substrate 10 in electrical contact with the vertical collector conductor 32. The heavily doped N-type semiconductor region 50 is effective to make contact to the collector of the bipolar transistor of the invention. The impurity concentration of the emitter 48 can be chosen by those skilled in the art to satisfy particular operating constraints or parameters of the bipolar transistor of the invention.

Figure 10:
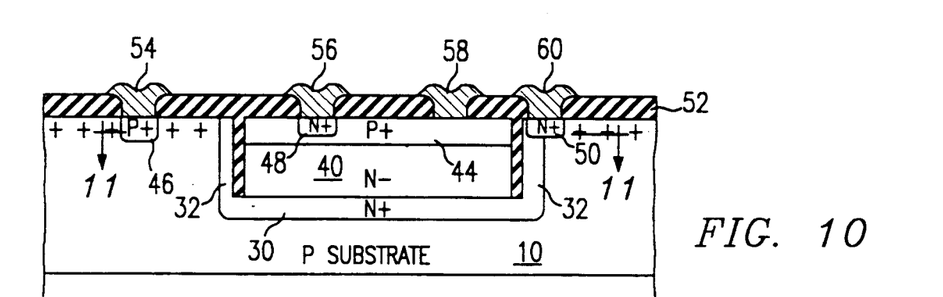

FIG. 10 illustrates the completed bipolar transistor of the invention, including metal contacts to the various semiconductor regions. The surface of the wafer is first covered with a dielectric or other electrical insulating material, such as shown by reference character 52. The insulator 52 is patterned to define openings to the various semiconductor regions. Next, and in accordance with conventional interconnect metallization processes, a layer of conducting material, such as aluminum, is deposited over the surface of the wafer and masked and patterned to define the various conductors and interconnect patterns. Shown is a contact 54 which makes electrical connection through the P-type region 46 to the substrate 10. An emitter contact 56 provides an electrical connection to the semiconductor emitter region 48. Another contact 58 is formed over the epitaxial material 40 for providing contact to the base semiconductor region 44. An off-site collector contact 60 is formed in electrical contact with the heavily doped surface semiconductor region 50 for providing electrical continuity to the buried collector layer 30, via the vertical collector conductor 32. Because the vertical collector conductor 32 circumscribes the epitaxial material 40, additional collector contacts 60 and corresponding regions 50 can be formed around the bipolar transistor to provide reduced collector resistance.

The bipolar transistor construction described above is particularly well suited for fabrication of lateral PNP devices. While not shown, a lateral PNP device can be formed in the epitaxial material 40 without encompassing additional masking or diffusion steps. A lateral PNP bipolar transistor formed in the epitaxial material 40 avoids undesired substrate currents which are a common problem in lateral PNP devices otherwise fabricated with SBC techniques. In such well known PNP transistor constructions, parasitic bipolar transistors provided parallel paths for collector current which give rise to the undesired substrate currents. Such currents are undesirable as they can cause latchup and other problems. In accordance with a lateral PNP transistor of the invention, parasitic transistor gain in a lateral direction is substantially reduced by the sidewall dielectric 34 of the trench depression. In like manner, parasitic transistor gain in a vertical direction is substantially reduced by the highly conductive region 30 at the bottom of the trench depression 26. Hence, lateral PNP devices formed alone, or together with NPN devices, in the epitaxial material 40 provide optimal operation in that substrate currents are reduced.

Figure 11:
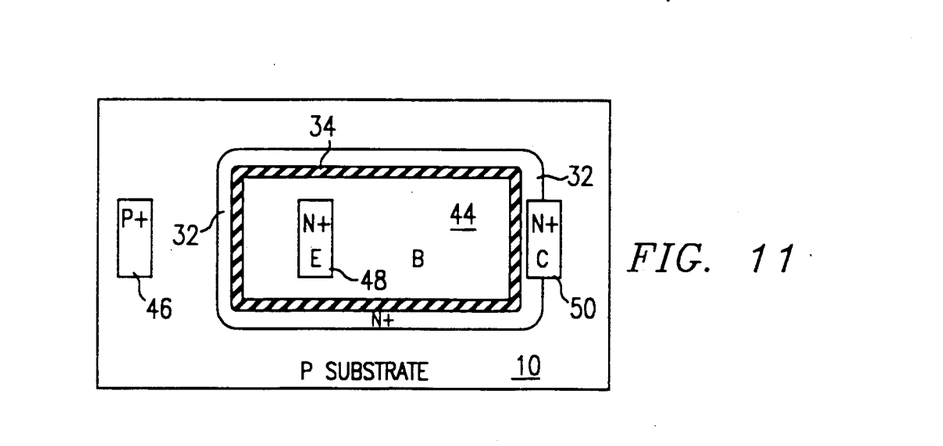
FIG. 11 is a top sectional view of the bipolar transistor, taken along line 11—11 of FIG. 10.

FIG. 11 illustrates a top sectional view of the bipolar transistor of FIG. 10, taken along line 11—11 thereof. As noted, the bipolar transistor fabricated in accordance with the invention requires reduced wafer area, as the isolation dielectric 34 is not subjected to lateral spreading during wafer processing, as is the case with conventional diffusion isolation regions. Indeed, the isolation dielectric thickness is independent of the depth to which it is formed within the substrate 10, and thus the lateral area required by the bipolar transistor of the invention is not a function of the depth of the epitaxial material 40. Accordingly, a technical advantage of the invention is that high voltage transistors which require deep epitaxial regions 40 do not require substantial additional lateral wafer area for isolation structures. In comparing a standard buried collector bipolar transistor having an annular deep N+ ring with the transistor of the invention, each having comparable emitter and base regions, each require significantly different wafer areas. For example, the SBC transistor requires about five times the wafer area of that of the transistor of the invention.

Figure 12:
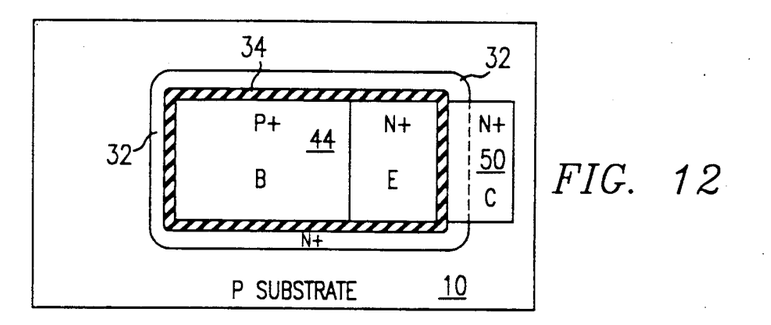
FIG. 12 is a top sectional view of a bipolar transistor constructed in accordance with another embodiment of the invention.

The wafer area of the transistor of the invention can be further reduced by the alternate structure illustrated in FIG. 12. Here, the emitter is formed abutted against the sidewall oxide isolation 34. With this construction, the wafer area of the bipolar transistor can be further reduced by a factor of about thirty percent.

Figure 13:
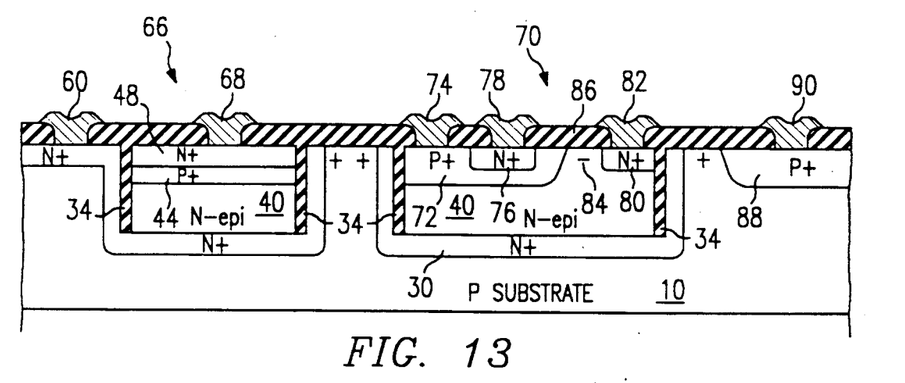
FIG. 13 is a sectional view of alternate constructions of the bipolar transistor of the invention.

FIG. 13 is a sectional view of a semiconductor wafer having formed therein various embodiments of the transistor of the invention. Bipolar transistor 66 is fabricated similar to that described above, having the emitter 48 extending between the sidewalls of the isolation dielectric 34. The cross-section shown is not taken through the contact of the transistor base 44, and thus it is not shown. Transistor 70 is fabricated having a semiconductor base region 72 which does not extend from one sidewall of the isolation dielectric 34, but rather has been masked so that a portion of the epitaxial material 40 extends to the surface of the wafer. The semiconductor base region 72 is associated with a contact 74, while the semiconductor emitter region 76 is associated with contact 78. A collector contact region 80 is formed within the isolated epitaxial material 40 to effect a contact to the bipolar transistor collector region. A collector contact 82 is associated with the collector contact region 80. Other semiconductor components, such as resistors, can be formed at the surface of the epitaxial material 40. The channel stop 84 is effective to increase the thick field threshold associated with the oxide layer 86 to thereby provide a lateral electrical isolation of the components formed at the surface of the epitaxial material 40. Shown also formed within the substrate material 10 is a heavily doped P+ region 88, and associated contact 90, for providing a surface electrical contact to the substrate 10.

Figure 14:
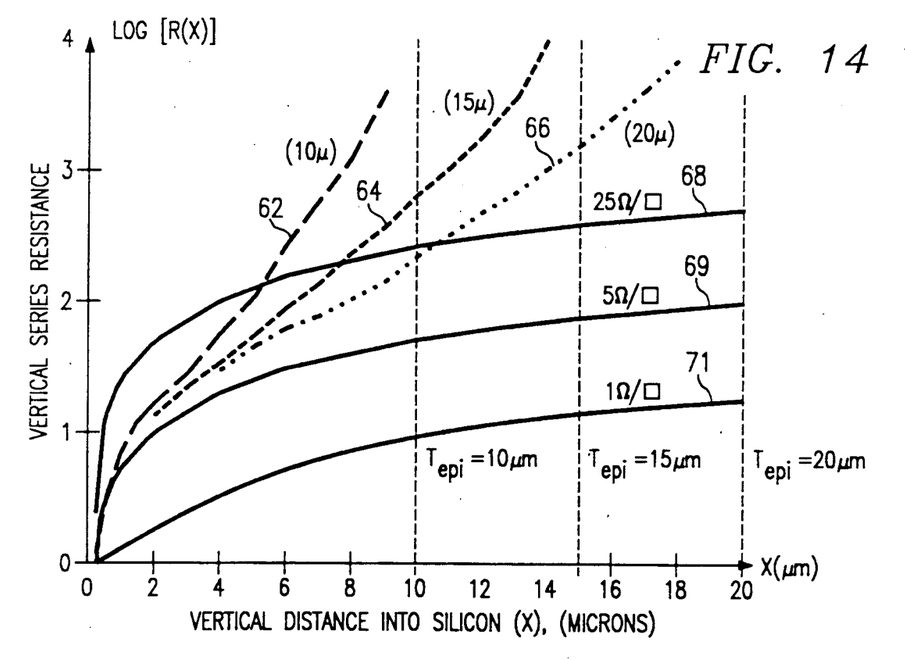
FIG. 14 graphically depicts the collector resistance characteristics of the transistor of the invention, as compared to well-known bipolar transistor construction techniques.

FIG. 14 graphically depicts the approximate vertical series collector resistance of a deep collector diffusion through a one square micron opening for various bipolar transistor constructions as a function of the depth into the silicon in which the diffusion was formed. Particularly, a bipolar transistor of standard buried collector fabrication and that of the invention are illustrated. The collector resistance of a standard buried collector type of transistor varies significantly as a function of epitaxial depth. To that end, it is to be noted that the vertical axis of the graph is scaled in a logarithmic manner. The horizontal axis represents the depth into the epitaxial material, as measured from the surface. Line 62 illustrates the vertical collector resistance of an SBC transistor fabricated within an epitaxial layer having a thickness of 10 microns. In like manner, lines 64 and 66 illustrate the collector resistances of respective SBC bipolar transistors fabricated in epitaxial layers having respective thicknesses of 15 and 20 microns. In contrast, line 68 illustrates the exemplary collector resistance of a bipolar transistor fabricated in accordance with the invention. Significantly, line 68 is representative of a vertical collector conductor having a sheet resistance of about 25 ohms/square. If the vertical collector conductor 32 were formed with a sheet resistance of 5 ohms/square, as is typical of SBC-type transistors, a lower vertical resistance would be realized, as shown by line 69. As noted above, a silicide formed on the surfaces of the trench depression can lower the sheet resistance thereof, as noted by line 71.

As noted in FIG. 14, the collector resistance of an SBC transistor fabricated in ten micron thick epitaxial material is low at the surface of the epitaxial material and increases dramatically near the bottom of the epitaxial layer. The incremental collector resistance can thus be significant between a surface contact and a buried collector region located at the bottom of the epitaxial layer. SBC transistors fabricated in 15 and 20 micron thick epitaxial material (lines 64 and 66) exhibit similar resistance characteristics, and thus represent a limitation on the lower limit of collector resistance. While the collector resistance of SBC transistors can be lowered by diffusing the deep N+ collector conductor deeper into the substrate, the advantage thereof is offset by the requirement of significantly more lateral wafer area.

The collector resistance of the bipolar transistor of the invention is more uniform between the surface and the bottom of the epitaxial layer, as noted by the reduced slope of the line 68. The primary reason for such a characteristic is that the vertical bipolar conductor 32 is diffused laterally into the sidewall of the substrate 10, rather than being diffused downwardly into the substrate or epitaxial material, as is the case with SBC transistors. A resultant technical advantage of the invention is that the collector resistance varies significantly less as a function of the epitaxial thickness. The incremental collector resistance is thus substantially independent of the type of transistor and the epitaxial thicknesses. Also, with the transistor fabrication of the invention, the size of a transistor varies less as a function of the thickness of the epitaxial material.

Figure 15:
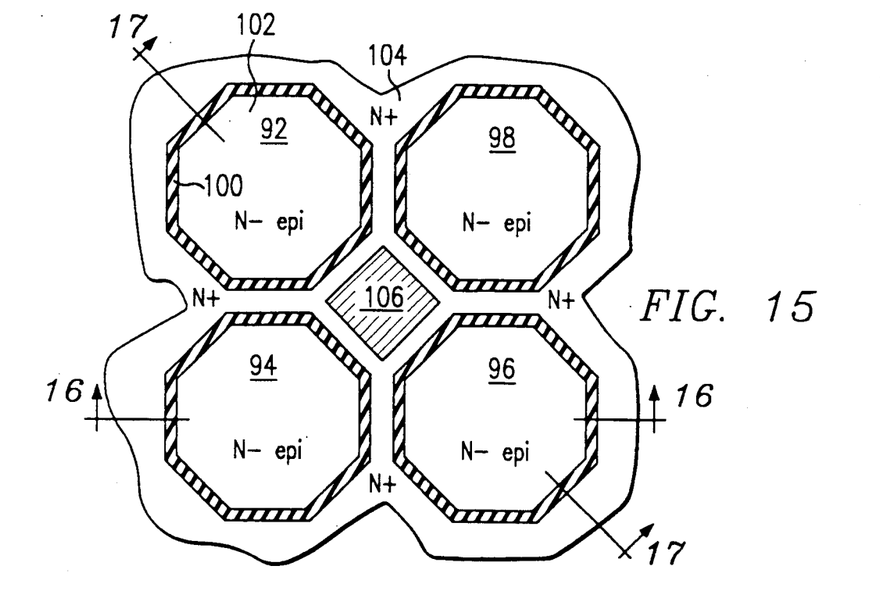
FIG. 15 is a top sectional view of plural transistors of the invention nested together in a honeycomb structure to increase the combined current capabilities thereof.

The principles and concepts of the invention can be advantageously utilized for fabricating power bipolar transistors. Power transistors are generally characterized by high current capabilities. This is conventionally accomplished by constructing a number of individual transistors in parallel to thereby increase the overall current carrying capability of the combination. FIG. 15 illustrates a four-transistor power device constructed in accordance with the invention. While only four transistors are illustrated, it can be envisioned how additional transistors can be added to form a compact arrangement defining a honeycomb transistor structure.

Transistor 92, as well as transistors 94-98 are octagonal in shape, as viewed from the surface of the wafer. Thus, the corresponding dielectric 100 which insulates each such transistor is also octagonal in shape. While not shown, the bipolar transistor devices themselves are fabricated within the single crystal silicon epitaxial material 102 in the manner described above, and laterally isolated within the sidewall dielectric 100. Significantly, the volume or space occupied by the epitaxial material 102 and the sidewall dielectric 100 is that area which would be patterned so that the substrate can be etched for removal thereof. It can be appreciated that a technical advantage presented by the invention is that the epitaxial material 102 is selectively deposited only in those areas where transistors are to be formed, rather than being deposited as a uniform layer of such epitaxial material over the wafer and carving it up into individual transistor islands, as is common with prior techniques.

Surrounding each sidewall dielectric 100 is an N+ semiconductor region 104 which defines a common vertical collector conductor as described above. Also as described, the vertical collector conductor 104 is formed by the lateral diffusion of impurities through the sidewall of the trench depression into the semiconductor substrate material. A common collector contact region 106 is formed central to the transistors 92-98 and provides a heavily doped region for contacting the vertical collector conductor 104 which surrounds each of the bipolar transistors 92-98. The collector contact region 106 is preferably formed as a heavily doped N+ region by the same masking, patterning and diffusion process utilized in forming the emitter regions of each of the transistors 92-98.

Figure 16:
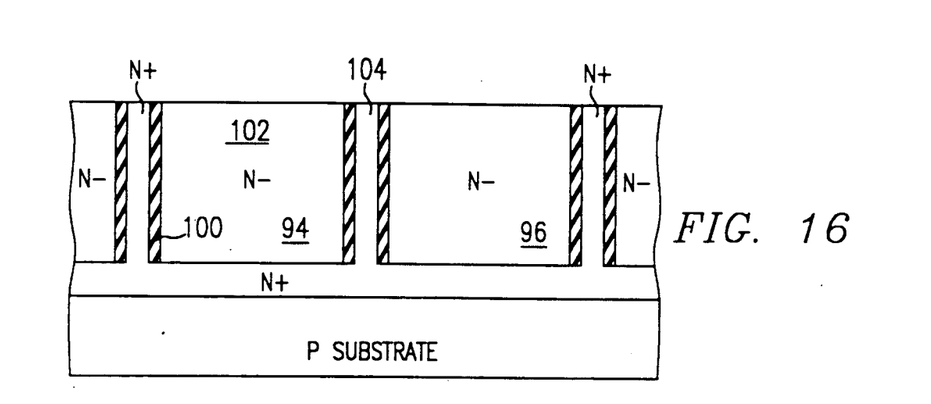
FIGS. 16 and 17 are sectional views of the honeycomb transistor structure of FIG. 15.
Figure 17:
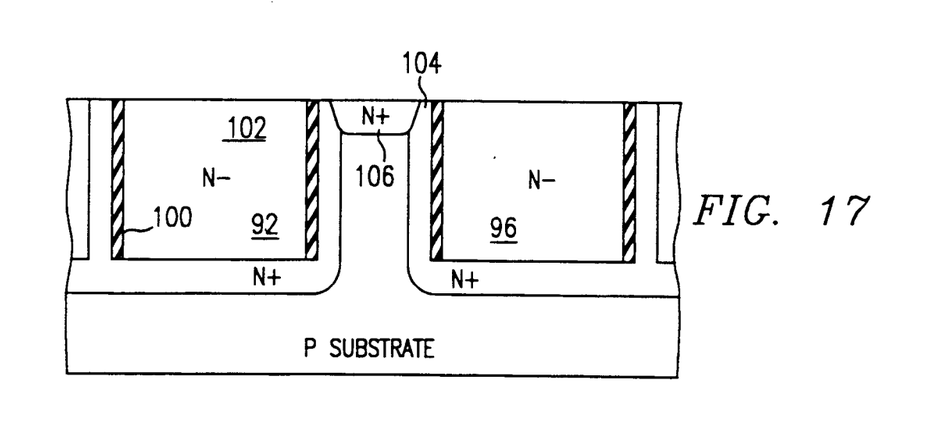

FIG. 16 is a sectional view of the honeycomb power transistor of FIG. 15, taken along line 16—16. In like manner, FIG. 17 is a sectional view of FIG. 16, illustrating the common collector contact 106.

From the foregoing, disclosed is a bipolar transistor having improved collector resistance characteristics and which can be fabricated in a small wafer area. The trench depression construction of the transistor allows the vertical collector conductor to be formed by lateral diffusion of impurities, thereby eliminating or substantially reducing the vertical conductivity gradient normally encountered in vertical diffusing processes. In addition, a sidewall dielectric formed on the trench depression provides a thin lateral electrical isolation between the transistor regions and thereby enables a more compact density of devices within a given wafer area. The fabrication steps of the invention provide self-alignment of the buried collector, the vertical collector conductor and the dielectric isolation, thereby permitting the transistor to be fabricated with fewer masking steps than heretofore known. The fabrication of the bipolar transistor of the invention lends itself well to the formation of a high current carrying structure, by utilizing a honeycomb construction having a common collector contact.

While the preferred and other embodiments of the invention have been described with reference to specific fabrication techniques and resulting structures, it is to be understood that many changes in detail may be made as a matter of engineering choices, without departing from the spirit and scope of the invention as defined by the appended claims.

What is claimed is:

1. A method for fabricating bipolar transistor, comprising the steps of:
   forming a trench depression in a semiconductor substrate;
   forming a heavily doped layer of semiconductor material as a shell around said trench depression;
   forming an insulating layer on the sidewalls of said trench depression, a bottom portion of said trench depression being defined by said heavily doped shell;
   forming a semiconductor collector material in a lower portion of said trench depression;
   forming a semiconductor base material in said collector material; and
   forming a semiconductor emitter material in said base material.

2. The method of claim 1, further including forming a heavily doped collector contact region outside said dielectric layer in said substrate and in electrical contact with said heavily doped shell.

3. The method of claim 1, further including forming said transistor in an area of said substrate comprising no more than about fifty square microns.

4. The method of claim 1, further including forming said transistor in an area of said substrate comprising no more than about thirty square microns.

5. The method of claim 1, further including forming a plurality of said transistors adjacent each other, and forming a semiconductor collector conductor common to each said transistor.

6. The method of claim 5, further including forming a single vertical collector conductor central to each said transistor.

7. The method of claim 5, further including forming each said transistor as an octagonal cell in said substrate.

8. The method of claim 1, further including forming a low resistance silicide surface on the sidewalls of the trench depression.

9. A method for fabricating a bipolar transistor adapted for improved current carrying capability, comprising the steps of:
   forming a trench depression in a semiconductor substrate;
   forming a heavily doped semiconductor collector region adjacent sidewalls of said trench depression, said heavily doped collector region having a substantially uniform vertical doping profile so that incremental resistance changes thereof as measured in a vertical direction are substantially uniform;
   forming a semiconductor collector material within said trench depression;
   forming a semiconductor base region within said collection material; and forming a semiconductor emitter region within said base region.

10. The method of claim 9, further including forming an insulating layer defining a dielectric between said collector material and a portion of said heavily doped collector region.

11. The method of claim 10, further including forming said collector material as an epitaxial deposit of semiconductor material which is laterally isolated from said substrate by said insulating dielectric layer.

12. The method of claim 10, further including forming said insulating layer as a cylindrically shaped structure.

13. The method of claim 9, further including forming said heavily doped collector region within said trench depression so as to define a shell of heavily doped material on the sidewalls and bottom of said trench depression.

14. The method of claim 13, further including forming said dielectric only on the sidewalls of said trench depression.

15. The method of claim 13, further including forming a vertical part of said collector region at the same time as said bottom collector region is formed.

16. The method of claim 9, wherein said collector region is formed by a lateral diffusion of impurities into the sidewalls of said trench depression.

17. The method of claim 9, further including forming a semiconductor resistor within one of said base region or said emitter region, and further including forming a channel stop providing surface isolation to said resistor.

18. The method of claim 9, further including forming a low resistance silicide surface on the sidewalls of said trench depression.

19. A method for processing a semiconductor wafer to form different channel stop areas in different areas of the wafer, comprising the steps of:

forming a blanket implant of a first impurity over the surface of the wafer to form a surface channel stop;

forming trench depressions in the surface of the wafer to define transistor operating areas;

covering the surface of the semiconductor wafer with a masking material;

anisotropically etching the semiconductor wafer to uniformly remove the masking material so that the bottoms of the trench depressions are removed of substantially all said masking material;

selectively growing an epitaxial semiconductor material within said trench depressions; and blanket implanting the surface of the wafer so that a second impurity is driven into the surface of the epitaxial semiconductor material but not into other masked surface areas of the wafer previously implanted with said first impurity.

20. The method of claim 19, further including covering the semiconductor wafer with a first masking material utilized for forming said trench depressions, and then forming a second masking material over the surface of the wafer so that the surface of the wafer has a thicker masking material than the bottoms of said trench depressions.

21. The method of claim 19, wherein said first and second implant impurities are different.

22. The method of claim 19, wherein said first implant impurity is an acceptor type impurity, and said second implant impurity is a donor-type impurity.

23. The method of claim 19, further including masking the wafer with a dielectric, and said anisotropic etch forms a sidewall dielectric on sidewalls of said trench depressions.

24. The method of claim 19, further including forming channel stop areas of said first and second implants with different type impurities and without a photoresist masking step.

25. The method of claim 19, further including forming said second implant self-aligned in said epitaxial material using said masking material.

* * * * *